(12) United States Patent
Cheng

(10) Patent No.: US 8,085,608 B2
(45) Date of Patent: Dec. 27, 2011

(54) SIGNAL ADJUSTING SYSTEM AND SIGNAL ADJUSTING METHOD

(75) Inventor: Wen-Chang Cheng, Taoyuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 226 days.

(21) Appl. No.: 12/568,689

(22) Filed: Sep. 29, 2009

(65) Prior Publication Data

US 2010/0309737 A1    Dec. 9, 2010

(30) Foreign Application Priority Data

Jun. 8, 2009 (TW) ................................ 98119036 A

(51) Int. Cl.
*G11C 7/00* (2006.01)
(52) U.S. Cl. .................. 365/193; 365/191; 365/194
(58) Field of Classification Search .................. 365/193, 365/191, 194, 233, 189.05, 226, 189.03, 365/189.16, 230.08, 189.11, 205, 207; 327/107, 327/175
See application file for complete search history.

(56) References Cited

U.S. PATENT DOCUMENTS

| | | | |
|---|---|---|---|
| 2003/0042834 A1* | 3/2003 | Dean et al. | 313/309 |
| 2007/0176658 A1* | 8/2007 | Ishikawa | 327/161 |
| 2008/0052430 A1* | 2/2008 | Kato et al. | 710/71 |
| 2009/0209850 A1* | 8/2009 | Tao et al. | 600/425 |

* cited by examiner

*Primary Examiner* — Dang Nguyen
(74) *Attorney, Agent, or Firm* — Winston Hsu; Scott Margo

(57) ABSTRACT

A signal adjusting system includes: a signal generating apparatus for transmitting a first driving signal and a second driving signal, a plurality of signal transmitting paths coupled to the signal generating apparatus, and a controlling apparatus coupled to the plurality of signal transmitting paths for receiving a first transmitted signal corresponding to the first driving signal and a second transmitted signal corresponding to the second driving signal, and detecting a phase difference between the first transmitted signal and the second transmitted signal to generate a detected result for the signal generating apparatus, wherein the signal generating apparatus adjusts a first driving ability of the first driving signal and a second driving ability of the second driving signal according to the detected result.

21 Claims, 5 Drawing Sheets

SIGNAL ADJUSTING SYSTEM AND SIGNAL ADJUSTING METHOD

BACKGROUND OF THE INVENTION

1. Field of the Invention

The present invention relates to a signal adjusting system and related adjusting method, and more particularly to a memory system that reduces phase differences between a plurality of transmitted signals, and a related method.

2. Description of the Prior Art

In a memory system, the data signal transmitting between a controlling chipset and a memory is accomplished by data transmitting paths installed between the controlling chipset and the memory. For the transmitted data signal with a specific frequency, the transmitting path is just like a low pass filter. In other words, a data signal with different frequencies would have different transmitting times when transmitted through a transmitting path of the same length. Accordingly, if the data signals with different frequencies are transmitted with a synchronized phase at the starting end of the transmitting path, then the phases of the data signals will be asynchronous at the terminal end of the transmitting path. FIG. 1 is a timing diagram illustrating a conventional memory system which employs a transmitting path to transmit two data signals with different frequencies between the controlling chipset and the memory. For brevity, the frequency F1 of the first data signal $s_1$ is faster than the frequency F2 of the second data signal $s_2$. In addition, the phase of the first data signal $s_1$ is synchronized with the phase of the second data signal $s_2$ when the first data signal $s_1$ and the second data signal $s_2$ are transmitted by the memory at time $t_1$. However, the controlling chipset receives the first data signal $s_1$ and the second data signal $s_2$ with different phases. This is because the first data signal $s_1$ with the faster frequency would have a shorter transmission time through the transmitting path, and the second data signal $s_2$ with the slower frequency would have a longer transmission time through the transmitting path. Therefore, the second data signal $s_2$ is still being transmitted when the controlling chipset receives the first data signal $s_1$ at time $t_2$. The second data signal $s_2$ is then received by the controlling chipset at time $t_3$. Accordingly, the controlling chipset receives incorrect data from the first data signal s1 and the second data signal s2 since the first data signal s1 and the second data signal s2 are asynchronous. Providing an efficient way to solve the phase difference of the data signals emerging from the transmitting path between the controlling chipset and the memory is a significant concern in a memory system.

SUMMARY OF THE INVENTION

One of the objectives of the present invention is therefore to provide a memory system that reduces phase differences between a plurality of transmitted signals, and a method thereof.

According to an embodiment of the present invention, a signal adjusting system is disclosed. The signal adjusting system comprises a signal generating apparatus, a plurality of signal transmitting paths, and a controlling apparatus. The signal generating apparatus transmits a first driving signal and a second driving signal. The plurality of signal transmitting paths are coupled to the signal generating apparatus, and the plurality of signal transmitting paths comprise a first signal transmitting path, a second signal transmitting path, a third signal transmitting path, and a fourth signal transmitting path. The first signal transmitting path transmits the first driving signal. The second signal transmitting path transmits the second driving signal. The third signal transmitting path transmits a detecting signal. The fourth signal transmitting path transmits a synchronizing signal. The controlling apparatus is coupled to the plurality of signal transmitting paths for receiving a first transmitted signal corresponding to the first driving signal and receiving a second transmitted signal corresponding to the second driving signal, and detecting a phase difference between the first transmitted signal and the second transmitted signal to generate the detecting signal to the signal generating apparatus. The signal generating apparatus adjusts a first driving capability upon the first driving signal and a second driving capability upon the second driving signal according to the detecting signal to generate a first adjusting amount and a second adjusting amount respectively, and the first adjusting amount is substantially equal to the second adjusting amount, or the first adjusting amount is not equal to the second adjusting amount.

According to a second embodiment of the present invention, a signal adjusting method is disclosed. The signal adjusting method comprises the following steps: a) transmitting a first driving signal and a second driving signal; b) providing a plurality of signal transmitting paths, the plurality of signal transmitting paths comprising: a first signal transmitting path for transmitting the first driving signal; a second signal transmitting path for transmitting the second driving signal; a third signal transmitting path for transmitting a detecting signal; and a fourth signal transmitting path for transmitting a synchronizing signal; c) receiving a first transmitted signal corresponding to the first driving signal and receiving a second transmitted signal corresponding to the second driving signal, and detecting a phase difference between the first transmitted signal and the second transmitted signal to generate the detecting signal; and d) adjusting a first driving capability upon the first driving signal and a second driving capability upon the second driving signal according to the detecting signal to generate a first adjusting amount and a second adjusting amount respectively, wherein the first adjusting amount is substantially equal to the second adjusting amount, or the first adjusting amount is not equal to the second adjusting amount.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
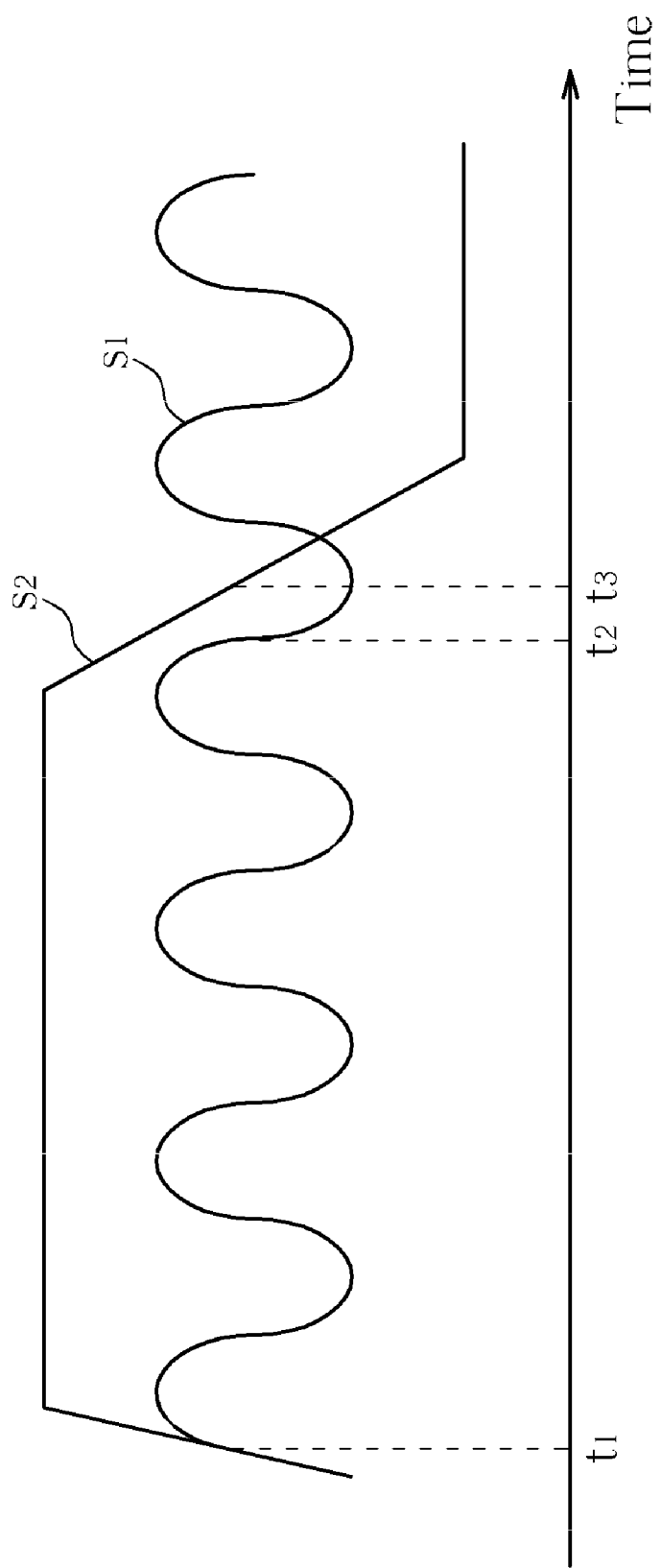
FIG. 1 is a timing diagram illustrating a conventional memory system.
Figure 2:
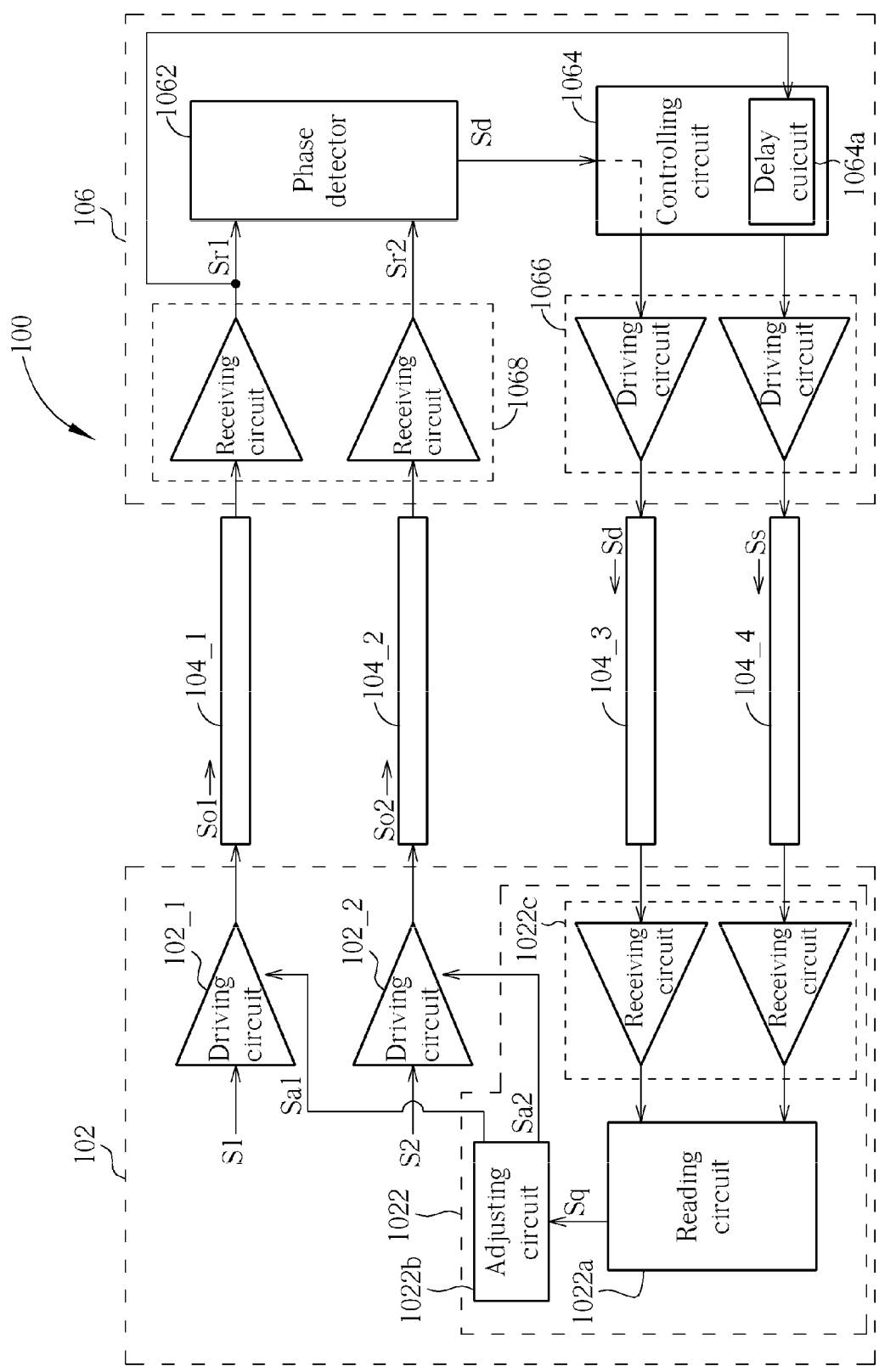
FIG. 2 is a diagram illustrating a signal adjusting system according to an embodiment of the present invention.

Please refer to FIG. 2. FIG. 2 is a diagram illustrating a signal adjusting system 100 according to an embodiment of the present invention. The signal adjusting system 100 comprises a signal generating apparatus 102, a plurality of signal transmitting paths 104_1-104_2, and a controlling apparatus 106. In this embodiment, the signal generating apparatus 102 is installed in a memory chipset, and the controlling apparatus 106 is installed in a memory controller. Therefore, the signal adjusting system 100 may be a memory system, such as a double-data-rate random-accessed memory (DDRRAM) system. The signal generating apparatus 102 generates a plurality of driving signals So1-So2 according to a plurality of pre-output signals S1-S2 respectively. Please note that the plurality of pre-output signals S1-S2 are the data strobe signal DQS and the data strobe signal DQSB, wherein the data strobe signals DQS, DQSB are configured as differential pair signals. Furthermore, the plurality of signal transmitting paths 104_1-104_2 are coupled to the signal generating apparatus 102 to transmit the plurality of driving signals So1-So2 to the controlling apparatus 106 respectively. Normally, in the DDRRAM system, the transmitting paths configured to transmit the differential pair signals have substantially the same layout length, and the transmitting paths are close to each other, therefore the physical and electrical characteristics of the plurality of signal transmitting paths 104_1-104_2 are substantially the same as each other. The controlling apparatus 106 is coupled to the plurality of signal transmitting paths 104_1-104_2 for receiving a plurality of transmitted signals Sr1-Sr2 corresponding to the plurality of driving signals So1-So2 respectively, and detecting the phase difference between the first transmitted signal Sr1 and the second transmitted signal Sr2 to generate a detecting signal Sd. The signal adjusting system 100 further comprises a signal transmitting path 104_3 and a signal transmitting path 104_4, which are coupled between the signal generating apparatus 102 and the controlling apparatus 106, wherein the signal transmitting path 104_3 is utilized for transmitting the detecting signal Sd to the signal generating apparatus 102, and the signal transmitting path 104_4 is utilized for transmitting a synchronizing signal Ss to the signal generating apparatus 102. Furthermore, the signal generating apparatus 102 generates a first adjusting amount and a second adjusting amount to adjust a first driving capability A1 upon the first driving signal So1 and a second driving capability A2 upon the second driving signal So2 respectively according to the detecting signal Sd, and the first adjusting amount is substantially equal to the second adjusting amount, or the first adjusting amount is not equal to the second adjusting amount. Please note that the present embodiment does not limit the way of adjusting the driving capability. In another embodiment, the first driving capability A1 corresponds to a first driving current, and the second driving capability A2 corresponds to a second driving current, and this also belongs to the scope of the present invention.

The controlling apparatus 106 comprises a phase detector 1062 and a controlling circuit 1064. The phase detector 1062 is coupled to the first signal transmitting path 104_1 and the second signal transmitting path 104_2 for detecting the phase difference between the first transmitted signal Sr1 and the second transmitted signal Sr2 to generate the detecting signal Sd correspondingly. The controlling circuit 1064 is coupled to the phase detector 1062 for generating the detecting signal Sd and the synchronizing signal Ss according to the first transmitted signal Sr1 and the output of the phase detector 1062. Furthermore, the controlling circuit 1064 further comprises a delay circuit 1064a coupled to the first signal transmitting path 104_1 for delaying the first transmitted signal Sr1 by a specific delay time Dsyn to generate the synchronizing signal Ss.

The signal generating apparatus 102 comprises a plurality of driving circuits 102_1-102_2 and a setting module 1022, wherein the plurality of driving circuits 102_1-102_2 drive the plurality of pre-output signals S1-S2 by the first driving capability A1 and the second driving capability A2 respectively to generate the plurality of driving signals So1-So2. The setting module 1022 is coupled to the plurality of driving circuits 102_1-102_2 to generate the first adjusting amount and the second adjusting amount to respectively adjust the first driving capability A1 upon the first driving signal So1 and the second driving capability A2 upon the second driving signal So2 according to the detecting signal Sd. The setting module 1022 comprises a reading circuit 1022a and an adjusting circuit 1022b. The reading circuit 1022a is coupled to the signal transmitting path 104_3 and a signal transmitting path 104_4 for reading the detecting signal Sd to generate a reading result Sq according to the synchronizing signal Ss. The adjusting circuit 1022b is coupled to the reading circuit 1022a and the driving circuits 102_1-102_2 for generating the adjusting signals Sa1-Sa2 to adjust the first driving capability A1 upon the first driving signal So1 and the second driving capability A2 upon the second driving signal So2 according to the reading result Sq of the reading circuit 1022a. Furthermore, if the signal generating apparatus 102 comprises more than two driving circuits (e.g., the signal generating apparatus 102 further comprises a third driving circuit with a third driving capability for generating a third driving signal with a third signal amplitude to a fifth signal transmitting path), the adjusting circuit 1022b also adjusts a third adjusting amount corresponding to the third driving capability according to the reading result Sq, wherein the first adjusting amount, the second adjusting amount, and the third adjusting amount are substantially equal to each other, or the first adjusting amount, the second adjusting amount, and the third adjusting amount are not equal to each other. In this embodiment, the adjusting circuit 1022b is a de-emphasis circuit, but this is not a limitation of the present invention. In other words, any circuit capable of adjusting the signal amplitude of the driving signal also belongs to the scope of the present invention.

Please note that, in this embodiment, the frequency Sf1 of the first driving signal So1 is faster than the frequency Sf2 of the second driving signal So2, but this is not a limitation of the present invention. In addition, when the phase detector 1062 detects that the phase of the first transmitted signal Sr1 leads the phase of the second transmitted signal Sr2, the phase detector 1062 outputs the detecting signal Sd with a high voltage level (i.e., 1); otherwise, when the phase detector 1062 detects that the phase of the first transmitted signal Sr1 lags the phase of the second transmitted signal Sr2, the phase detector 1062 outputs the detecting signal Sd with a low voltage level (i.e., 0). Similarly, this is not a limitation of the present embodiment. Furthermore, the delay circuit 1064a is utilized to delay the first transmitted signal Sr1 by the specific delay time Dsyn such that the synchronizing signal Ss is synchronized with the detecting signal Sd. The practical circuit of the reading circuit 1022a is not limited to this example. In one embodiment of the present invention, the reading circuit 1022a is implemented by a latch circuit. In addition, the elements coupled to the two terminals of the plurality of signal transmitting paths 104_1-104_4 (i.e., those in the shape of a triangle in FIG. 2) are the signal driving circuit (i.e., 1066) and the signal receiving circuit (i.e., 1068, 1022c). Since the operation of these elements is well-known to those skilled in this art, a detailed description is omitted here for brevity.

Figure 3:
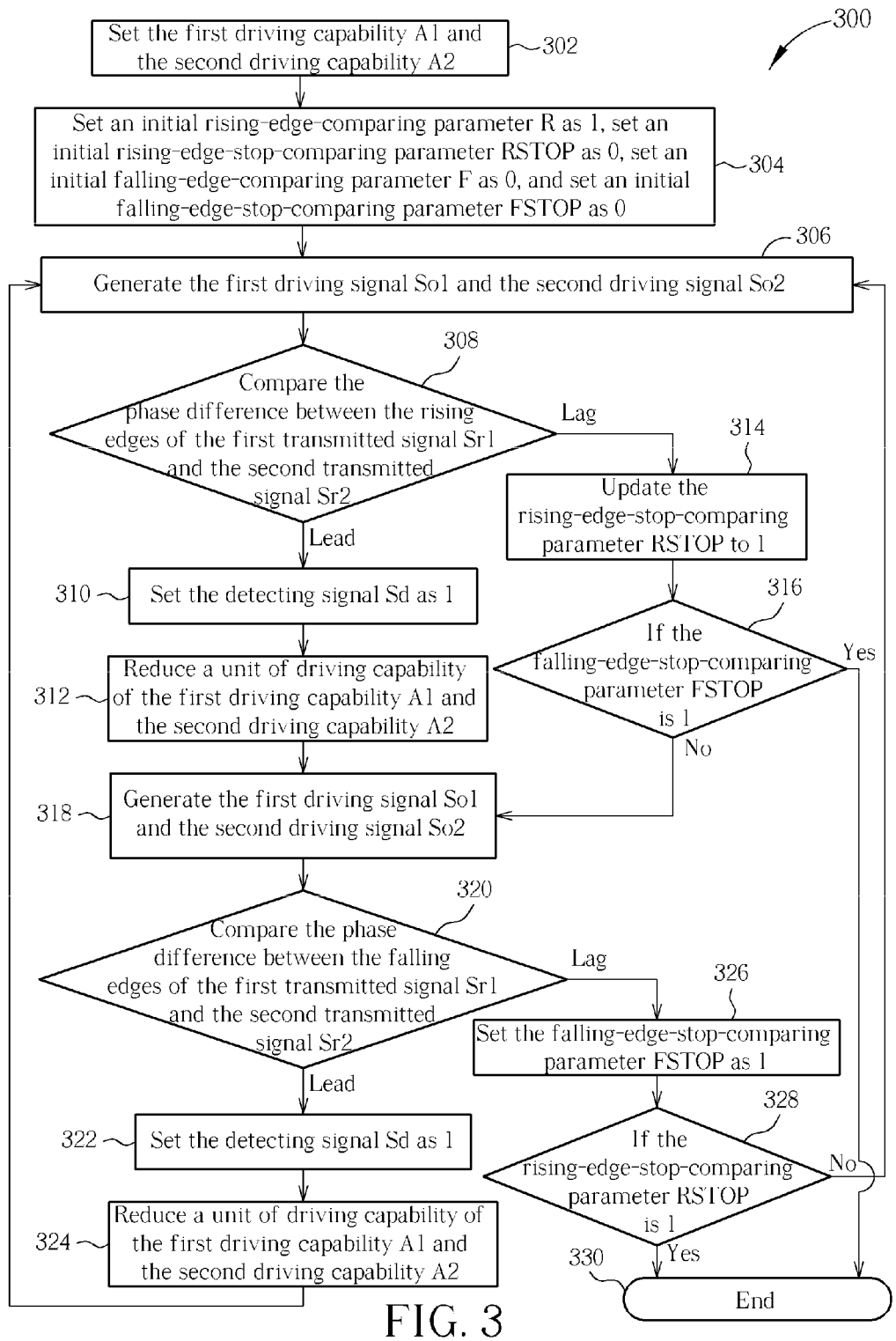
FIG. 3 is a flowchart illustrating a signal adjusting method according to an embodiment of the present invention.

Please refer to FIG. 3. FIG. 3 is a flowchart illustrating a signal adjusting method 300 according to an embodiment of the present invention. The signal adjusting method 300 may be implemented by the signal adjusting system 100 of the present invention. Therefore, to more clearly illustrate the signal adjusting method 300, the following description is illustrated in accordance with the signal adjusting system 100. Furthermore, provided that substantially the same result is achieved, the steps of the flowchart shown in FIG. 3 need not be in the exact order shown and need not be contiguous, that is, other steps can be intermediate. The signal adjusting method 300 comprises the following steps:

Step 302: set the first driving capability A1 of the first driving circuit 102_1 as the maximum driving capability to generate the first driving signal So1, and set the second driving capability A2 of the second driving circuit 102_2 as the maximum driving capability to generate the second driving signal So2;

Step 304: set an initial rising-edge-comparing parameter R as 1, set an initial rising-edge-stop-comparing parameter RSTOP as 0, set an initial falling-edge-comparing parameter F as 0, and set an initial falling-edge-stop-comparing parameter FSTOP as 0;

Step 306: generate the first driving signal So1 and the second driving signal So2 with the synchronized rising edge;

Step 308: Compare the phase difference between the rising edges of the first transmitted signal Sr1 and the second transmitted signal Sr2; if the phase of the first transmitted signal Sr1 leads the phase of the second transmitted signal Sr2, go to step 310, if the phase of the first transmitted signal Sr1 lags the phase of the second transmitted signal Sr2; go to step 314;

Step 310: set the detecting signal Sd as 1;

Step 312: reduce a unit of driving capability of the first driving capability A1 upon the first driving signal So1 and the second driving capability A2 upon the second driving signal So2 according to the detecting signal Sd and the synchronizing signal Ss; go to step 318;

Step 314: update the rising-edge-stop-comparing parameter RSTOP to 1;

Step 316: determine if the falling-edge-stop-comparing parameter FSTOP is 1; if yes, go to step 330, if no, go to step 318;

Step 318: generate the first driving signal So1 and the second driving signal So2 with the synchronized falling edge;

Step 320: Compare the phase difference between the falling edges of the first transmitted signal Sr1 and the second transmitted signal Sr2; if the phase of the first transmitted signal Sr1 leads the phase of the second transmitted signal Sr2, go to step 322, if the phase of the first transmitted signal Sr1 lags the phase of the second transmitted signal Sr2, go to step 326;

Step 322: set the detecting signal Sd as 1;

Step 324: reduce a unit of driving capability of the first driving capability A1 upon the first driving signal So1 and the second driving capability A2 upon the second driving signal So2 according to the detecting signal Sd and the synchronizing signal Ss; go to step 306;

Step 326: set the falling-edge-stop-comparing parameter FSTOP as 1;

Step 328: determine if the rising-edge-stop-comparing parameter RSTOP is 1; if yes, go to step 330, if no, go to step 306;

Step 330: end.

Please note that the present embodiment does not limit the implementation of the first driving circuit 102_1. In this embodiment, the first driving circuit 102_1 utilizes a P-type transistor to drive the rising edge of the first driving signal So1, and utilizes an N-type transistor to drive the falling edge of the first driving signal So1. Similarly, the second driving circuit 102_2 utilizes a P-type transistor to drive the rising edge of the second driving signal So2, and utilizes an N-type transistor to drive the falling edge of the second driving signal So2. When the signal adjusting system 100 is fabricated, the driving signals So1-So2 with different frequencies may have different transmitting times on the signal transmitting path 104_1-104_2 respectively. As a result, the controlling apparatus 106 receives the transmitted signals Sr1-Sr2 at different times. To calibrate the receiving times of the transmitted signals Sr1-Sr2 to be the same time, the signal generating apparatus 102 sets the first driving capability A1 of the first driving circuit 102_1, which is designed to generate the first driving signal So1, as the maximum driving capability initially, and sets the second driving capability A2 of the second driving circuit 102_2, which is designed to generate the second driving signal So2, as the maximum driving capability initially (step 302). Then, in step 304, the signal generating apparatus 102 sets the initial rising-edge-comparing parameter R as 1, sets the initial rising-edge-stop-comparing parameter RSTOP as 0, sets the initial falling-edge-comparing parameter F as 0, and sets the initial falling-edge-stop-comparing parameter FSTOP as 0. Since the initial rising-edge-comparing parameter R is 1, the signal generating apparatus 102 generates the first driving signal So1 and the second driving signal So2 with synchronized rising edges (i.e., having the same phase), as stated in step 306.

When the first driving signal So1 and the second driving signal So2 are transmitted through the first signal transmitting path 104_1 and the second signal transmitting path 104_2 respectively, the first transmitted signal Sr1 corresponding to the first driving signal So1 and the second transmitted signal Sr2 corresponding to the second driving signal So2 are received by the phase detector 1062. Then, the phase detector 1062 compares the phase difference of the rising edges of the first transmitted signal Sr1 and the second transmitted signal Sr2 (step 308). If the phase of the first transmitted signal Sr1 leads the phase of the second transmitted signal Sr2, the phase detector 1062 outputs the detecting signal Sd as 1. If the phase of the first transmitted signal Sr1 lags the phase of the second transmitted signal Sr2, the phase detector 1062 outputs the detecting signal Sd as 0. Meanwhile, the delay circuit 1064a delays the first transmitted signal Sr1 by the specific delay time Dsyn such that the synchronizing signal Ss is synchronized with the detecting signal Sd.

Then, the signal transmitting path 104_3 and the signal transmitting path 104_4 transmit the detecting signal Sd and the synchronizing signal Ss to the signal generating apparatus 102 respectively. The synchronizing signal Ss triggers the reading circuit 1022a such that the reading circuit 1022a reads the value of the detecting signal Sd. Then, the reading circuit 1022a generates the reading result Sq corresponding to the detecting signal Sd to the adjusting circuit 1022b. When the detecting signal Sd is 1, the adjusting circuit 1022b reduces a unit of driving capability of the P-type transistor of the first driving circuit 102_1 to reduce the rising time of the first driving signal So1. Meanwhile, the adjusting circuit 1022b reduces a unit of driving capability of the P-type transistor of the second driving circuit 102_2 to reduce the rising time of the second driving signal Sot. For example, the adjusting circuit 1022b reduces a unit of driving current of the P-type transistor of the first driving circuit 102_1 to decrease the rising time of the first driving signal So1 (step 312).

In step 308, when the phase detector 1062 outputs the detecting signal Sd as 0, the rising-edge-stop-comparing parameter RSTOP is updated to 1 to stop detecting the phase difference of the rising edges of the first transmitted signal Sr1 and the second transmitted signal Sr2. In step 316, the signal generating apparatus 102 determines if the falling-edge-stop-comparing parameter FSTOP is 1. When the falling-edge-stop-comparing parameter FSTOP is not 1 (i.e., 0), the signal generating apparatus 102 generates the first driving signal So1 and the second driving signal So2 with the synchronized falling edges (i.e., the same phases) to proceed to the next detection upon the phase difference of the falling edges (step 318).

Figure 4:
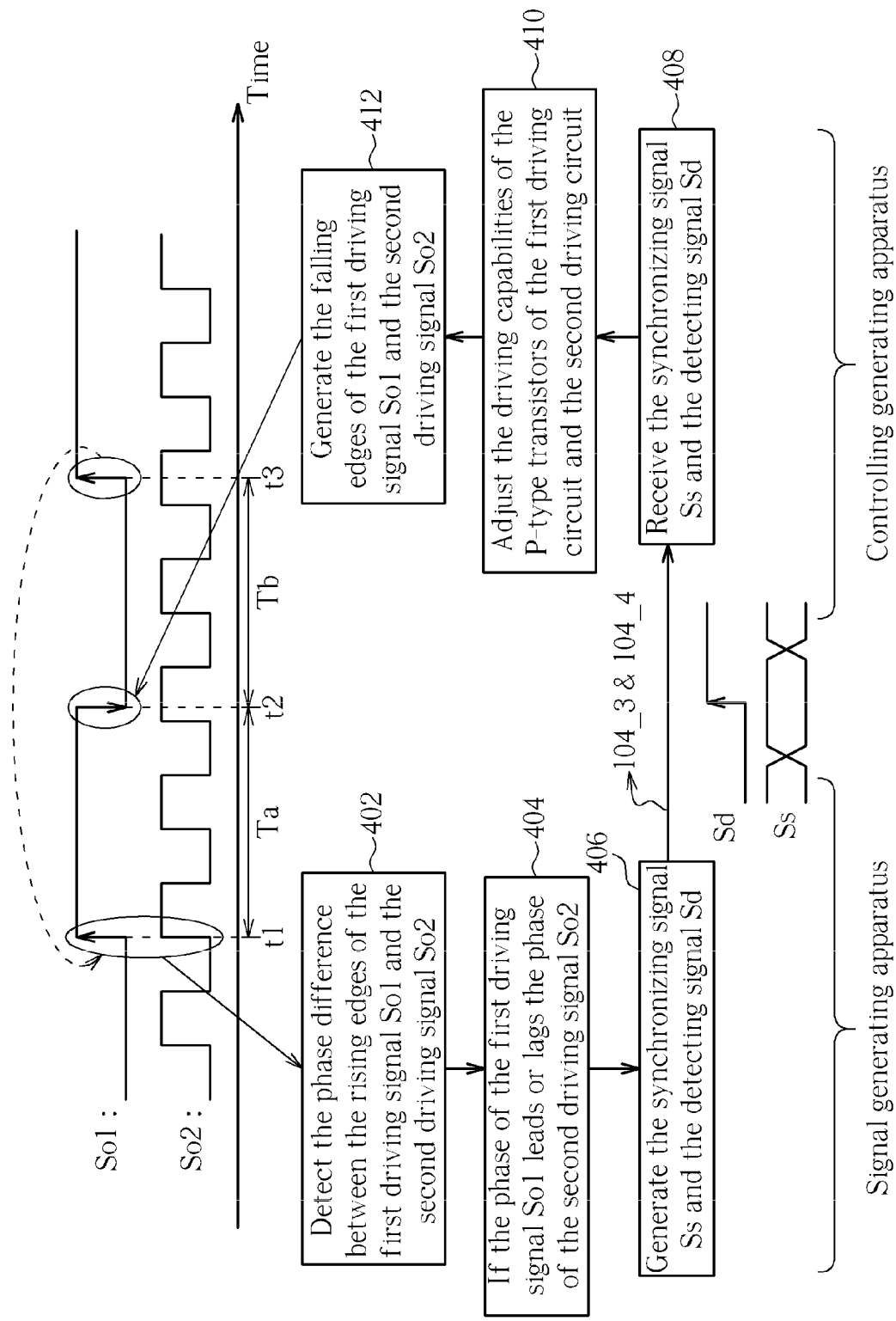
FIG. 4 is a timing diagram illustrating a first driving signal and a second driving signal of the signal adjusting system.

Please refer to FIG. 4. FIG. 4 is a timing diagram illustrating the first driving signal So1 and the second driving signal So2 of the signal adjusting system 100. At time t1, the signal generating apparatus 102 generates the first driving signal So1 and the second driving signal So2 with synchronized rising edges. After time Ta, the adjusting circuit 1022b adjusts the driving capabilities of the P-type transistors of the first driving circuit 102_1 and the second driving circuit 102_2 at time t2. Meanwhile, the first driving signal So1 and the second driving signal So2 are switched to the low voltage level (i.e., the falling edge). Then, the driving capabilities of the P-type transistors of the first driving circuit 102_1 and the second driving circuit 102_2 can be adjusted. After time Tb, the updated P-type transistors of the first driving circuit 102_1 and the second driving circuit 102_2 generate the rising edges of the first driving signal So1 and the second driving signal So2 by the updated driving capabilities. Please note that the time Ta and Tb represent the total elapsed time of the signal that is transmitted from the signal generating apparatus 102 to the controlling apparatus 106 (via the first signal transmitting paths 104_1 and the second signal transmitting path 104_2) and from the controlling apparatus 106 back to the signal generating apparatus 102 (via the third signal transmitting paths 104_3 and the second signal transmitting path 104_4). The dashed line arrow symbol in FIG. 4 means that the signal adjusting system 100 has the same operation at time t3 and time t1. To more clearly illustrate the present embodiment, the flowchart illustrating the process from detecting the phase difference of the rising edges of the first driving signal So1 and the second driving signal So2 to adjusting the driving capabilities of the P-type transistors of the first driving circuit 102_1 and the second driving circuit 102_2 is also shown in FIG. 4. The process comprises the following steps:

Step 402: detect the phase difference between the rising edges of the first driving signal So1 and the second driving signal So2;

Step 404: determine if the phase of the first driving signal So1 leads or lags the phase of the second driving signal So2;

Step 406: generate the synchronizing signal Ss and the detecting signal Sd;

Step 408: receive the synchronizing signal Ss and the detecting signal Sd;

Step 410: adjust the driving capabilities of the P-type transistors of the first driving circuit 102_1 and the second driving circuit 102_2;

Step 412: generate the falling edges of the first driving signal So1 and the second driving signal So2;

wherein the steps from 402 to 406 are accomplished in the signal generating apparatus 102, and the steps 408 to 412 are accomplished in the controlling apparatus 106.

In addition, via the first signal transmitting path 104_1 and the second signal transmitting path 104_2, the first transmitted signal Sr1 and the second transmitted signal Sr2 corresponding to the first driving signal So1 and the second driving signal So2 respectively are received by the phase detector 1062. Meanwhile, the phase detector 1062 detects the phase difference between the falling edges of the first transmitted signal Sr1 and the second transmitted signal Sr2 (step 320). If the phase of the first transmitted signal Sr1 leads the phase of the second transmitted signal Sr2, the phase detector 1062 sets the detecting signal Sd as 1 (step 322). On the other hand, if the phase of the first transmitted signal Sr1 lags the phase of the second transmitted signal Sr2, the phase detector 1062 sets the detecting signal Sd as 0 (step 322). Meanwhile, the delay circuit 1064a delays the first transmitted signal Sr1 by a specific delay time Dsyn such that the synchronizing signal Ss is synchronized with the detecting signal Sd.

Then, the signal transmitting path 104_3 and the signal transmitting path 104_4 transmit the detecting signal Sd and the synchronizing signal Ss to the signal generating apparatus 102 respectively. The synchronizing signal Ss triggers the reading circuit 1022a such that the reading circuit 1022a reads the value of the detecting signal Sd. Then, the reading circuit 1022a generates the reading result Sq corresponding to the detecting signal Sd to the adjusting circuit 1022b. When the detecting signal Sd is 1, the adjusting circuit 1022b reduces a unit of driving capabilities of the N-type transistors of the first driving circuit 102_1 and the second driving circuit 102_2 to reduce the falling time of the first driving signal So1 and the second driving signal So2. For example, the adjusting circuit 1022b reduces a unit of driving current of the N-type transistor of the first driving circuit 102_1 to decrease the falling time of the first driving signal So1 (step 324).

In step 320, when the phase detector 1062 outputs the detecting signal Sd as 0, the falling-edge-stop-comparing parameter FSTOP is updated to 1 to stop detecting the phase difference of the falling edges of the first transmitted signal Sr1 and the second transmitted signal Sr2. In step 328, the signal generating apparatus 102 determines if the rising-edge-stop-comparing parameter RSTOP is 1. When the rising-edge-stop-comparing parameter RSTOP is not 1 (i.e., 0), the signal generating apparatus 102 generates the first driving signal So1 and the second driving signal So2 with the synchronized rising edges (i.e., the same phases) to proceed to the next detection upon the phase difference of the rising edges (step 306) according to the driving capability of the P-type transistor of the first driving circuit 102_1 that was set in step 312. Similarly, in step 316, when the falling-edge-stop-comparing parameter FSTOP is not 1 (i.e., 0), the signal generating apparatus 102 generates the first driving signal So1 and the second driving signal So2 with the synchronized falling edges (i.e., the same phases) to proceed to the next detection upon the phase difference of the falling edges (step 324) according to the driving capability of the N-type transistor of the first driving circuit 102_1 that was set in step 324.

Figure 5:
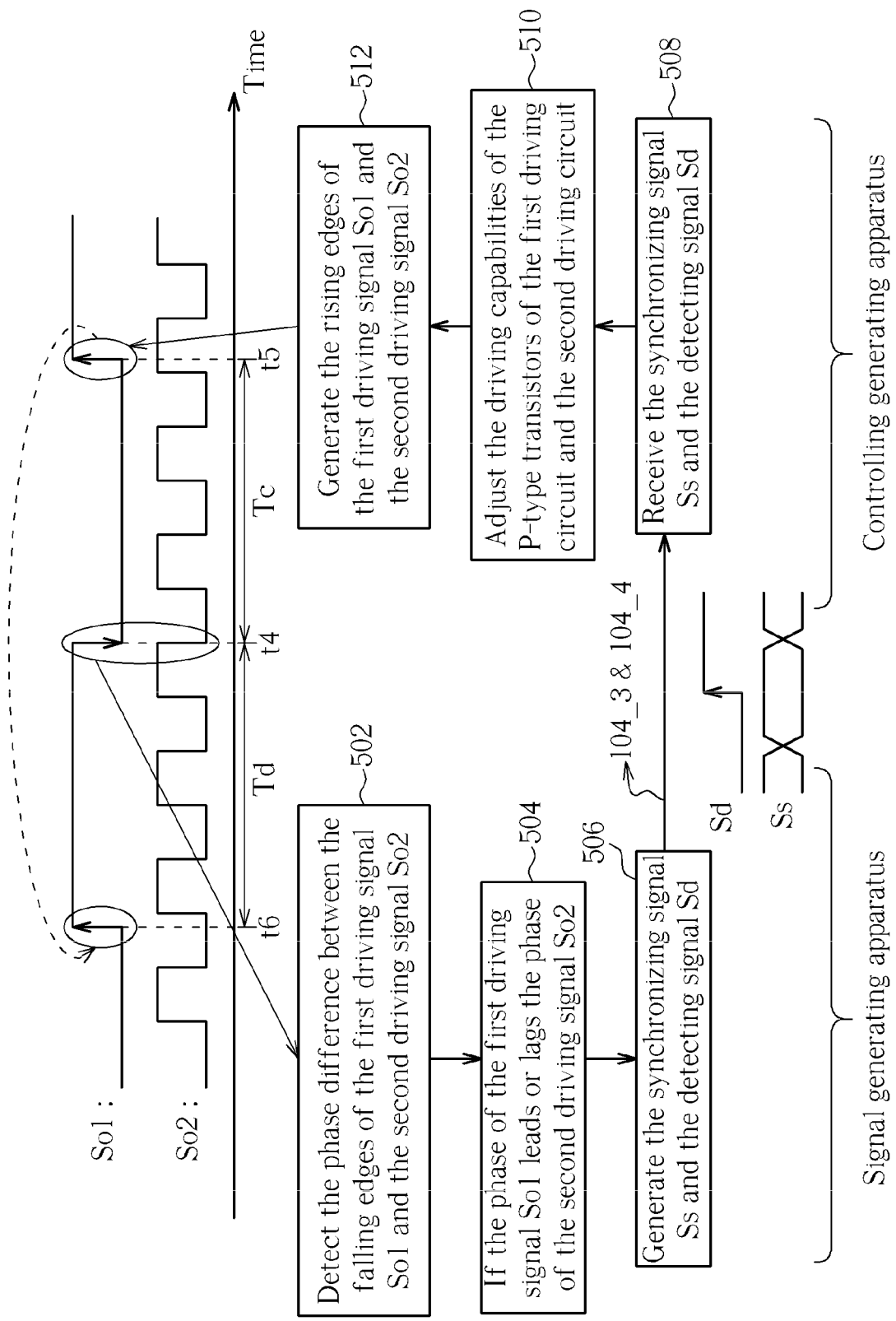
FIG. 5 is another timing diagram illustrating the first driving signal and the second driving signal of the signal adjusting system.

Please refer to FIG. 5. FIG. 5 is another timing diagram illustrating the first driving signal So1 and the second driving signal So2 of the signal adjusting system 100. At time t4, the signal generating apparatus 102 generates the first driving signal So1 and the second driving signal So2 with the synchronized falling edges. After time Tc, the adjusting circuit 1022b adjusts the driving capabilities of the N-type transistors of the first driving circuit 102_1 and the second driving circuit 102_2 at time t5. Meanwhile, the first driving signal So1 and the second driving signal So2 are switched to the high voltage level (i.e., the rising edge). Then, the driving capabilities of the N-type transistors of the first driving circuit 102_1 and the second driving circuit 102_2 can be adjusted. After time Td, the updated N-type transistors of the first driving circuit 102_1 and the second driving circuit 102_2 generate the falling edges of the first driving signal So1 and the second driving signal So2 by the updated driving capabilities. Please note that the time Tc and Td represent the total elapsed time of the signal transmitted from the signal generating apparatus 102 to the controlling apparatus 106 (via the first signal transmitting paths 104_1 and the second signal transmitting path 104_2) and from the controlling apparatus 106 back to the signal generating apparatus 102 (via the third signal transmitting paths 104_3 and the second signal transmitting path 104_4). The dashed line arrow symbol in FIG. 5 means that the signal adjusting system 100 has the same operation at time t5 and time t6. Similarly, to more clearly illustrate the present embodiment, the flowchart illustrating the process from detecting the phase difference of the falling edges of the first driving signal So1 and the second driving signal So2 to adjusting the driving capabilities of the N-type transistors of the first driving circuit 102_1 and the second driving circuit 102_2 is also shown in FIG. 5. The process comprises the following steps:

Step 502: detect the phase difference between the falling edges of the first driving signal So1 and the second driving signal So2;

Step 504: determine if the phase of the first driving signal So1 leads or lags the phase of the second driving signal So2;

Step 506: generate the synchronizing signal Ss and the detecting signal Sd;

Step 508: receive the synchronizing signal Ss and the detecting signal Sd;

Step 510: adjust the driving capabilities of the P-type transistors of the first driving circuit 102_1 and the second driving circuit 102_2;

Step 512: generate the rising edges of the first driving signal So1 and the second driving signal So2;

wherein the steps from 502 to 506 are accomplished in the signal generating apparatus 102, and the steps 508 to 512 are accomplished in the controlling apparatus 106.

Accordingly, by adjusting the driving capabilities of the P-type/N-type transistors in the first driving circuit 102_1 and the second driving circuit 102_2, the rising/falling times of the first driving signal So1 and the second driving signal So2 are decreased, then the phase detector 1062 receives the first transmitted signal Sr1 and the second transmitted signal Sr2 with synchronized rising and falling edges (step 330). Finally, the signal generating apparatus 102 stores the circuit parameters corresponding to the final driving capabilities, such as the aspect ratio (W/L) of the transistors, to proceed to the following data processing.

Briefly, the present signal adjusting system 100, such as a DDRRAM system, employs a self-calibrating mechanism to adjust the signal amplitudes such that the phase differences between the transmitted signals received by the controlling apparatus 106 fall within a reasonable range, thereby solving the problems inherent in the above-mentioned conventional memory system.

Those skilled in the art will readily observe that numerous modifications and alterations of the device and method may be made while retaining the teachings of the invention.

What is claimed is:

1. A signal adjusting system, comprising:
    a signal generating apparatus, for transmitting a first driving signal and a second driving signal;
    a plurality of signal transmitting paths, coupled to the signal generating apparatus, the plurality of signal transmitting paths comprising:
        a first signal transmitting path, for transmitting the first driving signal;
        a second signal transmitting path, for transmitting the second driving signal;
        a third signal transmitting path, for transmitting a detecting signal; and
        a fourth signal transmitting path, for transmitting a synchronizing signal; and
    a controlling apparatus, coupled to the plurality of signal transmitting paths, for receiving a first transmitted signal corresponding to the first driving signal and receiving a second transmitted signal corresponding to the second driving signal, and detecting a phase difference between the first transmitted signal and the second transmitted signal to generate the detecting signal to the signal generating apparatus;
wherein the signal generating apparatus adjusts a first driving capability upon the first driving signal and a second driving capability upon the second driving signal according to the detecting signal to generate a first adjusting amount and a second adjusting amount respectively, and the first adjusting amount is substantially equal to the second adjusting amount, or the first adjusting amount is not equal to the second adjusting amount.

2. The signal adjusting system of claim 1, wherein the first driving capability and the second driving capability correspond to a first driving current and a second driving current respectively.

3. The signal adjusting system of claim 1, wherein a frequency of the first driving signal is faster than a frequency of the second driving signal.

4. The signal adjusting system of claim 3, wherein the controlling apparatus comprises:
    a phase detector, coupled to the first signal transmitting path and the second signal transmitting path, for detecting the phase difference between the first transmitted signal and the second transmitted signal; and
    a controlling circuit, coupled to the phase detector, for generating the detecting signal according to an output of the phase detector.

5. The signal adjusting system of claim 3, wherein the signal generating apparatus comprises:
    a first driving circuit, having the first driving capability, for generating the first driving signal having a first signal amplitude to the first signal transmitting path;
    a second driving circuit, having the second driving capability, for generating the second driving signal having a second signal amplitude to the second signal transmitting path;
    a setting module, coupled to the first driving circuit, for generating the first adjusting amount and the second adjusting amount to adjust the first driving capability and the second driving capability respectively according to the detecting signal, wherein the first adjusting amount is substantially equal to the second adjusting amount, or the first adjusting amount is not equal to the second adjusting amount.

6. The signal adjusting system of claim 5, wherein the controlling apparatus comprises a delay circuit, coupled to the first signal transmitting path, for delaying the first transmitted signal by a specific delay time to generate the synchronizing signal; the fourth signal transmitting path transmits the synchronizing signal to the setting module, and the setting module comprises:
 a reading circuit, for reading the detecting signal to generate a reading result according to the synchronizing signal; and
 an adjusting circuit, coupled to the reading circuit and the first driving circuit and the second driving circuit, for adjusting the first driving capability and the second driving capability according to the reading result;
wherein when the signal generating apparatus further comprises a third driving circuit, having a third driving capability, for generating a third driving signal having a third signal amplitude to a fifth signal transmitting path, the adjusting circuit adjusts a third adjusting amount corresponding to the third driving capability according to the reading result, wherein the first adjusting amount, the second adjusting amount, and the third adjusting amount are substantially equal to each other, or the first adjusting amount, the second adjusting amount, and the third adjusting amount are not equal to each other.

7. The signal adjusting system of claim 6, wherein when the reading result indicates that a phase of the first transmitted signal leads the phase of the second transmitted signal, the adjusting circuit reduces the first adjusting amount and the second adjusting amount to reduce the first driving capability and the second driving capability respectively, and when the signal generating apparatus further comprises the third driving circuit, and the phase of the second transmitted signal leads the phase of the third transmitted signal, the adjusting circuit reduces the third adjusting amount, wherein the first adjusting amount, the second adjusting amount, and the third adjusting amount are substantially equal to each other, or the first adjusting amount, the second adjusting amount, and the third adjusting amount are not equal to each other.

8. The signal adjusting system of claim 6, wherein when the reading result indicates that a phase of the first transmitted signal lags the phase of the second transmitted signal, the adjusting circuit increases the first adjusting amount and the second adjusting amount to increase the first driving capability and the second driving capability respectively, and when the signal generating apparatus further comprises the third driving circuit, and the phase of the second transmitted signal lags the phase of the third transmitted signal, the adjusting circuit reduces the third adjusting amount, wherein the first adjusting amount, the second adjusting amount, and the third adjusting amount are substantially equal to each other, or the first adjusting amount, the second adjusting amount, and the third adjusting amount are not equal to each other.

9. The signal adjusting system of claim 1, wherein the signal generating apparatus is applicable in a memory chipset.

10. The signal adjusting system of claim 9, wherein the first driving signal and the second driving signal are data strobe signals (DQS) of the memory chipset.

11. The signal adjusting system of claim 1, wherein the controlling apparatus is applicable in a memory controller.

12. A signal adjusting method, comprising:
 transmitting a first driving signal and a second driving signal;
 providing a plurality of signal transmitting paths, the plurality of signal transmitting paths comprising:
  a first signal transmitting path for transmitting the first driving signal;
  a second signal transmitting path for transmitting the second driving signal;
  a third signal transmitting path for transmitting a detecting signal; and
  a fourth signal transmitting path for transmitting a synchronizing signal;
 receiving a first transmitted signal corresponding to the first driving signal and receiving a second transmitted signal corresponding to the second driving signal, and detecting a phase difference between the first transmitted signal and the second transmitted signal to generate the detecting signal; and
 adjusting a first driving capability upon the first driving signal and a second driving capability upon the second driving signal according to the detecting signal to generate a first adjusting amount and a second adjusting amount respectively, wherein the first adjusting amount is substantially equal to the second adjusting amount, or the first adjusting amount is not equal to the second adjusting amount.

13. The signal adjusting method of claim 12, wherein the first driving capability and the second driving capability correspond to a first driving current and a second driving current respectively.

14. The signal adjusting method of claim 12, wherein a frequency of the first driving signal is faster than the frequency of the second driving signal.

15. The signal adjusting method of claim 14, wherein the steps of generating the detecting signal comprise:
 detecting the phase difference between the first transmitted signal and the second transmitted signal; and
 generating the detecting signal according to the phase difference.

16. The signal adjusting method of claim 14, wherein the step of transmitting the first driving signal and the second driving signal comprises:
 utilizing the first driving capability to generate the first driving signal having a first signal amplitude to the first signal transmitting path;
 utilizing the second driving capability to generate the second driving signal having a second signal amplitude to the second signal transmitting path; and
 generating the first adjusting amount and the second adjusting amount to adjust the first driving capability and the second driving capability respectively according to the detecting signal, wherein the first adjusting amount is substantially equal to the second adjusting amount, or the first adjusting amount is not equal to the second adjusting amount.

17. The signal adjusting method of claim 16, wherein the step of generating the detecting signal further comprises the step of utilizing a delay circuit to couple to the first signal transmitting path for delaying the first transmitted signal by a specific delay time to generate the synchronizing signal; and the step of adjusting the first signal amplitude comprises:
 reading the detecting signal to generate a reading result according to the synchronizing signal; and
 adjusting the first driving capability and the second driving capability according to the reading result;
wherein when a third driving capability is utilized for generating a third driving signal having a third signal amplitude to a fifth signal transmitting path, the method further comprises:
 adjusting a third adjusting amount corresponding to the third driving capability according to the reading result, wherein the first adjusting amount, the second adjusting amount, and the third adjusting amount are substantially equal to each other, or the first adjusting amount, the second adjusting amount, and the third adjusting amount are not equal to each other.

18. The signal adjusting method of claim 17, wherein when the reading result indicates that a phase of the first transmitted signal leads the phase of the second transmitted signal, the method further comprises:

reducing the first adjusting amount and the second adjusting amount to reduce the first driving capability and the second driving capability respectively;

and when the phase of the second transmitted signal leads the phase of the third transmitted signal, the method further comprises:

reducing the third adjusting amount;

wherein the first adjusting amount, the second adjusting amount, and the third adjusting amount are substantially equal to each other, or the first adjusting amount, the second adjusting amount, and the third adjusting amount are not equal to each other.

19. The signal adjusting method of claim 17, wherein when the reading result indicates that a phase of the first transmitted signal lags the phase of the second transmitted signal, the method further comprises:

increasing the first adjusting amount and the second adjusting amount to increase the first driving capability and the second driving capability respectively;

and when the phase of the second transmitted signal lags behind the phase of the third transmitted signal, the method further comprises:

increasing the third adjusting amount;

wherein the first adjusting amount, the second adjusting amount, and the third adjusting amount are substantially equal to each other, or the first adjusting amount, the second adjusting amount, and the third adjusting amount are not equal to each other.

20. The signal adjusting method of claim 12, being applicable in a memory chipset.

21. The signal adjusting method of claim 20, wherein the first driving signal and the second driving signal are data strobe signals (DQS) of the memory chipset.

* * * * *